US007330373B2

(12) United States Patent
Lee et al.

(10) Patent No.: US 7,330,373 B2
(45) Date of Patent: Feb. 12, 2008

(54) PROGRAM TIME ADJUSTMENT AS FUNCTION OF PROGRAM VOLTAGE FOR IMPROVED PROGRAMMING SPEED IN MEMORY SYSTEM

(75) Inventors: Shih-Chung Lee, Kanagawa (JP); Toru Miwa, Kanagawa (JP)

(73) Assignee: SanDisk Corporation, Milpitas, CA (US)

( * ) Notice: Subject to any disclaimer, the term of this patent is extended or adjusted under 35 U.S.C. 154(b) by 77 days.

(21) Appl. No.: 11/391,811

(22) Filed: Mar. 28, 2006

(65) Prior Publication Data

US 2007/0237008 A1    Oct. 11, 2007

(51) Int. Cl.
*G11C 16/12*    (2006.01)
(52) U.S. Cl. ............................ 365/185.19; 365/185.22; 365/185.18; 365/185.03
(58) Field of Classification Search ........... 365/185.19, 365/185.22, 185.18, 185.28, 185.03
See application file for complete search history.

(56) References Cited

U.S. PATENT DOCUMENTS

| 4,694,314 | A | | 9/1987 | Terada et al. .......... 365/185.23 |
| 5,012,445 | A | | 4/1991 | Kazuaki et al. ........ 365/189.06 |
| 5,596,527 | A | * | 1/1997 | Tomioka et al. ....... 365/185.03 |
| 5,596,532 | A | | 1/1997 | Cernea et al. ......... 365/185.18 |
| 5,751,637 | A | * | 5/1998 | Chen et al. ............ 365/185.33 |
| 5,991,201 | A | | 11/1999 | Kuo et al. ............. 365/185.19 |
| 6,040,996 | A | | 3/2000 | Kong ..................... 365/185.19 |
| 6,088,266 | A | | 7/2000 | Roohparvar ........... 365/185.19 |
| 6,104,636 | A | * | 8/2000 | Tada ..................... 365/185.24 |
| 6,128,223 | A | | 10/2000 | Sasai et al. ............ 365/185.18 |
| 6,172,917 | B1 | | 1/2001 | Kataoka et al. ....... 365/189.05 |
| 6,373,746 | B1 | | 4/2002 | Takeuchi et al. ...... 365/185.03 |
| 6,392,931 | B1 | | 5/2002 | Pasotti et al. ......... 365/185.19 |

(Continued)

FOREIGN PATENT DOCUMENTS

WO    WO 96/41346    12/1996

OTHER PUBLICATIONS

Tanzawa et al., "A Stable Programming Pulse Generator for Single Power Supply Flash Memories", IEEE Journal of Solid-State Circuits, vol. 32, No. 6, Jun. 1997, pp. 845-851.
Miyamoto et al., "High-Reliability Programming Method Suitable for Flash Memories of More than 256 Mb", Extended Abstracts of the International Conference on Solid State Devices and Materials, Japan Society of Applied Physics, Tokyo, Japan, Aug. 21, 1995, pp. 67-69.
USPTO, "Notice of Allowance and Fee(s) Due," mailed in related U.S. Appl. No. 11/392,265 on Sep. 12, 2007, 14 pages.

*Primary Examiner*—Andrew Q. Tran
(74) *Attorney, Agent, or Firm*—Davis Wright Tremaine LLP

(57) ABSTRACT

In a non-volatile memory system, the programming time period allocated for the program pulse is adjusted as a function of the voltage level of the pump pulse required so that the total number of pump pulses required to program the charge storage element to the required threshold voltage is reduced. For example, programming time period may be increased with an increase in the voltage level of the pump pulse required. This allows the programming time period of the program pulse to be increased to a value that compensates for the increased charge-up time that is required for the higher amplitude program pulses to reach the desired programming voltage.

28 Claims, 6 Drawing Sheets

U.S. PATENT DOCUMENTS

| | | | |
|---|---|---|---|
| 6,515,907 B2 | 2/2003 | Miyagi | 365/185.21 |
| 6,522,580 B2 | 2/2003 | Chen et al. | 365/185.02 |
| 6,556,465 B2 | 4/2003 | Haeberli et al. | 365/45 |
| 6,560,152 B1 | 5/2003 | Cernea | 365/211 |
| 6,650,153 B2 * | 11/2003 | Zerilli et al. | 327/134 |
| 6,882,567 B1 | 4/2005 | Wong | 365/185.03 |
| 6,937,520 B2 | 8/2005 | Ono et al. | 365/185.18 |
| 7,009,883 B2 | 3/2006 | Turner et al. | 365/185.22 |
| 7,110,298 B2 | 9/2006 | Moogat et al. | 365/185.18 |
| 7,227,783 B2 * | 6/2007 | Li | 365/185.18 |
| 7,262,998 B2 | 8/2007 | Moogat et al. | 365/185.18 |
| 2005/0157555 A1 | 7/2005 | Ono et al. | 365/185.18 |

* cited by examiner

PROGRAM TIME ADJUSTMENT AS FUNCTION OF PROGRAM VOLTAGE FOR IMPROVED PROGRAMMING SPEED IN MEMORY SYSTEM

CROSS-REFERENCE TO RELATED APPLICATION

This application is related to U.S. patent application Ser. No. 11/392,265, entitled, "Program Time Adjustment as Function of Program Voltage for Improved Programming Speed in Programming Method", filed on the same day as the present application; which application is incorporated in its entirety by reference as if fully set forth herein.

BACKGROUND OF THE INVENTION

This invention relates in general to non-volatile memory systems and, in particular, to a non-volatile memory system with programming time control.

The memory cells or charge storage elements (the two terms used herein interchangeably) of a non-volatile memory are typically programmed one partial or complete row of cells in parallel at a time. Programming voltage pulses are applied to the selected row of memory cells until the threshold voltage of each of the selected cells in the row has been programmed to a value within a predetermined voltage range (which may or may not be the final desired state of the cell) in a programming cycle. During each programming cycle, a time sequence of programming voltage pulses of voltage level or amplitude Vpgm are applied at predetermined time intervals, such as periodic time intervals, where the amplitude of each programming pulse has been incremented by a fixed voltage step $\Delta$Vpgm (e.g. 0.2 V) compared to the amplitude of the immediately preceding programming pulse in the sequence. An example of an array of memory cells or charge storage elements that are programmed in the above manner is a NAND cell array.

In time periods between the programming voltage pulses, program-verify operations are carried out. That is, the programmed level of each charge storage element (e.g. charge storage transistor) being programmed in parallel is read after each programming pulse to determine whether it is not less than the verify voltage level to which it is being programmed. If it is determined that the threshold voltage of a given charge storage element has exceeded the verify voltage level, programming of such charge storage element is stopped by raising the voltage of the bit line to which the particular charge storage element is connected to from a low voltage (typically 0 volts) to a high or inhibit level (typically Vdd). Programming of other charge storage elements being programmed in parallel continues until they in turn reach their verify voltage levels. After each program verify operation, if there still is one or more charge storage elements being programmed in parallel whose threshold voltage still has not reached the verify voltage level, the amplitude of the programming pulse is increased by the predetermined step size and applied again to the charge storage elements being programmed in parallel, which is followed again by a program-verify operation. If after the next programming operation the increased programming pulse still has not caused the threshold voltage of all of the charge storage elements being programmed in parallel to reach the verify voltage level, the amplitude of the programming pulse is increased yet again by the same predetermined step size during the next time interval and this process is repeated until threshold voltages of all of the charge storage elements being programmed in parallel have reached the verify voltage level. This marks the end of a particular programming cycle.

As will be evident from the above description, the above programming process requires repetitively programming the cells with a programming pulse followed by a program-verify operation. This process, therefore, can be time consuming. It is, therefore, desirable for the program time for the application of each programming pulse to have a short duration so that the memory cells or charge storage elements can be programmed to the desired threshold voltages in as short a time as possible.

The time sequence of programming pulses that are used to program charge storage elements is illustrated in FIG. 2A, where 13 such consecutive pulses are shown, although it is possible to employ a larger or fewer number of pulses for programming the elements to any particular threshold voltage. The voltage pulses may start at an initial program pulse level such as 15 volts and increase by a predetermined step size such as 0.2 volts for every pulse.

In FIG. 2A, the programming pulses in the sequence used to program charge storage elements are illustrated to have substantially vertical leading and trailing edges. In practice, the pulse shape of the programming pulses is different from those shown, because a charge pump typically requires a charge-up time to increase the voltage output from a reference voltage level to the required Vpgm level, and the pulse requires a time period to decrease back to the reference level at the trailing edge of the pulse. This is illustrated in FIGS. 1 and 2B.

As shown in FIG. 1, at time t0, the charge pump starts increasing the voltage output from a starting reference level such as the ground level, and applies the output to the selected control gate line or word line. However, it is not until the time t1 that the output of the charge pump reaches the required voltage level Vpgm that is effective for altering transistor threshold voltage as shown in FIG. 1. After the output of the charge pump reaches the required voltage level at time t1, this voltage level is maintained until a time t2 which marks the end of the time period in which the output of the charge pump is maintained at the required program voltage level Vpgm. Thereafter, the charge pump output declines back to the reference level by time t3. Thus the total program time allocated for programming the control gate line or word line is the sum of two of the three time periods: t0-t1 (or T) and t1-t2, and the memory proceeds to the next program pulse or program verify after t3. The time period t0-t1 or T is the charge-up time required for the charge pump in order to deliver the required program voltage level Vpgm. The time period t1-t2 is the pulse width, which is the effective program time during which the voltage of the selected control gate line or word line is ramped up to the desired Vpgm level effective for altering the threshold voltage of charge storage elements.

Thus in reference to FIG. 2A, each of the 13 pulses labeled 1 through 13 actually has a shape similar to that shown in FIG. 1. As illustrated in FIG. 2A, the Vpgm level that is required to be delivered by the charge pump increases by $\Delta$Vpgm every time a new charge pump pulse is generated, so that the required program voltage or Vpgm level trends higher from pulse 1 to pulse 13 as shown in FIG. 2A. A higher Vpgm level requires a longer charge-up time compared to a lower Vpgm as illustrated in FIG. 2B.

In conventional designs for charge pump control, the total program time allocated for programming the selected control gate line or word line is fixed and does not change with the increasing program voltage level Vpgm required. This situation is illustrated in FIG. 2B. Thus in reference to FIGS. 2A and 2B, for pulse 1 in FIG. 2A, the voltage level required to be delivered by the charge pump at Vpgm1 is still relatively low so that charge-up time T1 is relatively short, leaving most of the fixed program time available in conventional schemes for the charge pump to ramp up the control gate line or word line to the required voltage level Vpgm1. For the pulse 5, however, the Vpgm5 level that needs to be delivered by the charge pump is higher than that for pulse 1 so that a longer charge-up time T5 is required, leaving a shorter time available for applying the ramped up voltage at Vpgm5 level to the selected control gate line or word line effective for altering the threshold voltage of the charge storage elements controlled by such line. For pulse 10, the required voltage pump pulse level Vpgm10 is even higher so that an even longer charge-up time T10 is required leaving an even smaller portion of the fixed program time available for the charge pump output at Vpgm10 for altering the threshold voltage of the charge storage elements. This means that as the required programming voltage of the charge pump pulse is increased, the effective program time or pulse width is becoming shorter and shorter and therefore less and less effective in programming the charge storage elements to reach the verify voltage level. The net result is that a larger number of programming pulses must be applied to program all the cells that are programmed in parallel. This is undesirable since it reduces performance of the memory system.

The above programming operation applies both to multi-level charge storage elements as well as binary-level charge storage elements or memory cells. An illustration of the above programming and program-verify operations to multi-level charge storage elements is described in U.S. Pat. No. 6,522,580, which is incorporated herein by reference in its entirety.

One solution to the above problem is to increase the fixed time allocated for the programming, so that even at high programming voltages, the increased program time allocated allows the charge pump output at the required high Vpgm level to stay at such level for an adequate time for altering charge storage element threshold voltages even after an increased charge-up time. As noted above, for increased performance it will be desirable to minimize the programming time of each programming cycle in which the programming pulses are applied. Since allocating a longer programming time is needed only at high programming voltages (i.e. at high Vpgm levels) but not at low programming voltages, increasing the fixed program time for the generation and application of all of the charge pump pulses during the programming cycle would also be undesirable since it also increases the total programming time. It is therefore desirable to provide a non-volatile memory system, where the above-described difficulties are alleviated.

SUMMARY OF THE INVENTION

Ideally, it is desirable for the program time period allocated to be as short as possible during the beginning portion of the program cycle when the charge pump is called upon to supply low to moderate voltage outputs for the program pulses. As the programming cycle progresses, when higher amplitude programming voltages are called for, it is desirable for longer program time periods to be used instead of the shorter time period used initially.

This invention is based on the recognition that the program time period allocated for the voltage pump pulses can be increased when the charge pump is called upon to supply high voltage output for the program pulses. In one embodiment, the program time allocated for application of the voltage pump pulses is adjusted a plurality of times to values that reduce the number of pulses for programming the charge storage elements to a predetermined state (i.e. a state where the elements are within a predetermined range of threshold voltages). In one implementation of this embodiment, the program time allocated is controlled as a function of the number of program pulses that have been generated by the charge pump during a particular programming cycle. In another implementation of this embodiment, the program time allocated is controlled as a function of the amplitude or amplitudes of pulses provided by the charge pump without using any output of the charge pump.

In a different embodiment, at least one program time allocated for application of the voltage pump pulses is generated in response to at least one indicator signal indicative of the amplitude or amplitudes of pulses provided by the charge pump. In this embodiment, the indicator signal or signals are being generated without using amplitude of any output of the charge pump. In one implementation of such embodiment, the indicator signal or signals are provided by a program voltage control logic which also controls the voltage level of the pump pulses provided by the charge pump, and which controls the program time allocated. In another implementation of this embodiment, the indicator signal or signals are indicative of the number of program pulses that have been generated by the charge pump during a particular programming cycle.

BRIEF DESCRIPTION OF THE DRAWINGS

For simplicity in description, identical components are labeled by the same numerals in this application.

DESCRIPTION OF EXEMPLARY EMBODIMENTS

Figure 3:
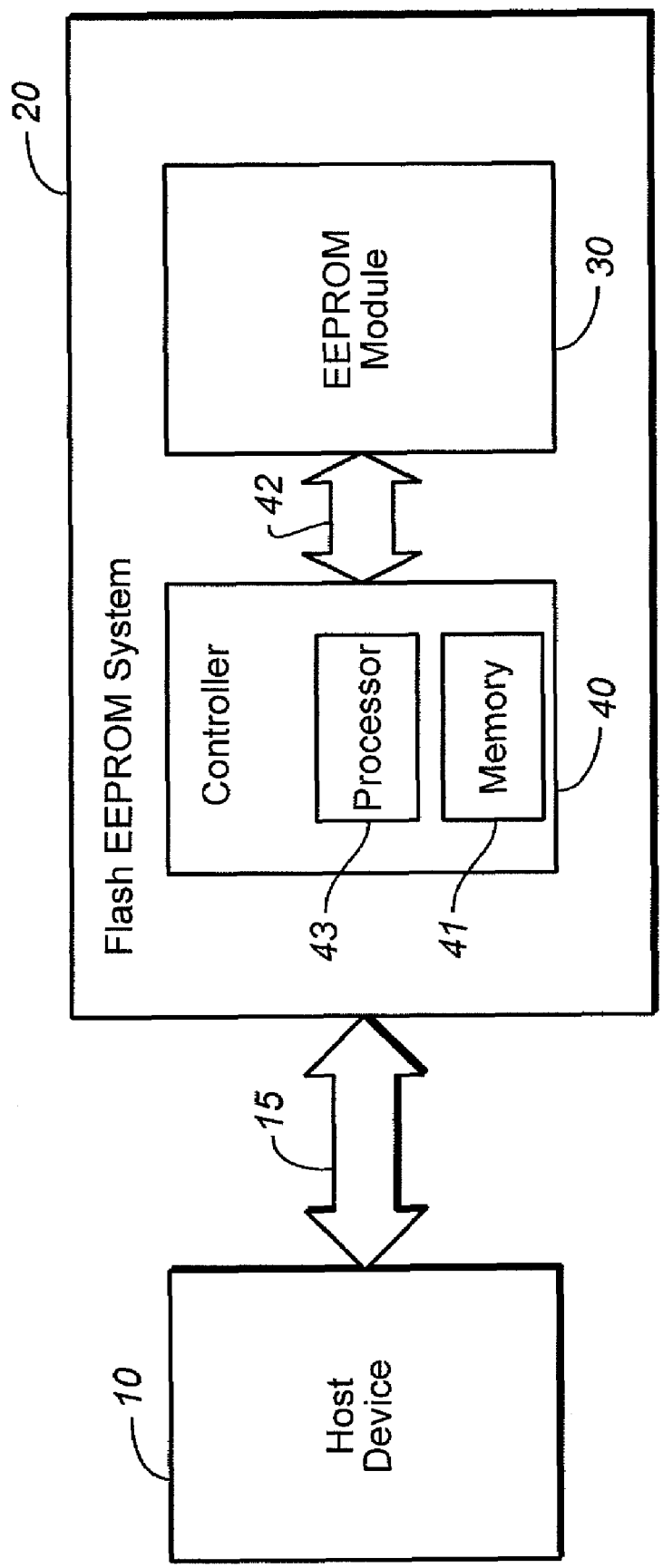
FIG. 3 illustrates a block diagram of a system including a host device and a flash EEPROM system connected to the host device.

FIG. 3 is a block diagram of a flash memory system 20 (which can be in the form of a plug-in card or module) in communication with a host device 10 (e.g. computer, camera, cellular phone, personal digital assistant, game controllers, and media players such as MP3 players) through system bus 15. The flash memory system 20 includes a flash EEPROM module 30 and a controller 40, which includes, in turn, memory 41 and a processor 43. Controller 40 interprets the commands received from the host computer 10 and translates them into corresponding read, write and other operations for the flash EEPROM module 30, in a manner transparent to the host computer 10.

Figure 4:
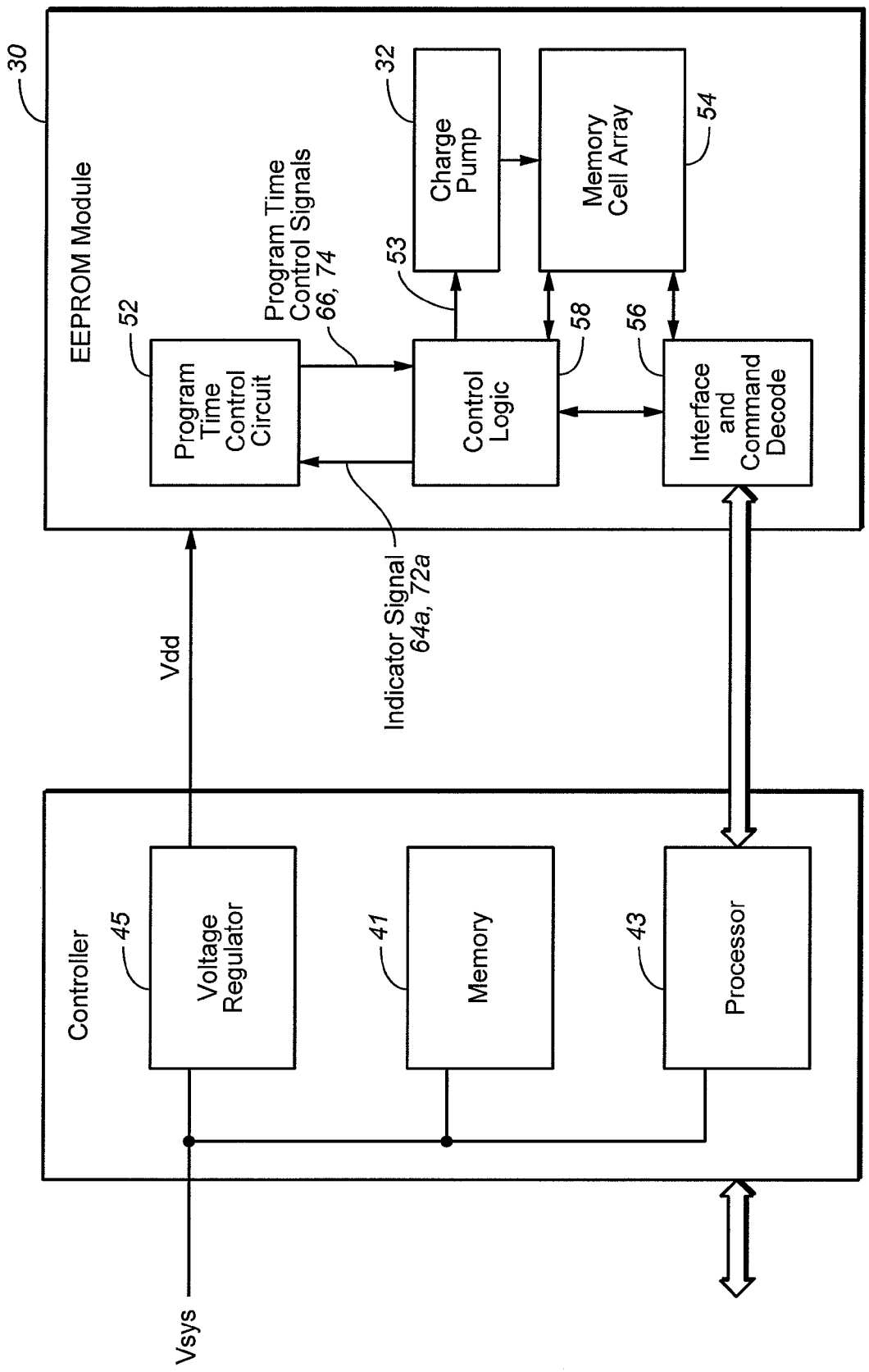
FIG. 4 is a block diagram of the controller and voltage generation portion of the flash EEPROM system of FIG. 3 to illustrate one embodiment of the invention.

FIG. 4 illustrates, as an example, a simplified block diagram of portions of the flash EEPROM system 20 related to the generation of the charge pump voltage pulses. In this application, the terms "voltage pump pulses", "pump pulses", "charge pump voltage pulses", "programming pulses" and "program pulses" are used interchangeably. As shown in FIG. 4, the supply voltage Vsys is applied by the host 10 to controller 40 and through an optional voltage regulator 45; a possibly different voltage level, Vdd, is applied to module 30. Processor 43 applies commands and data to module 30 and the charge pump 32 generates the programming pulses from the voltage Vdd in response to the control signals from control logic 58. In practice there is usually sufficient logic in the control logic 58 in the non-volatile memory 30 to control the detailed operation of the memory, relieving Processor 43 from this responsibility. Typically Decode Module 56 consists of sufficient logic to interpret commands from Processor 43 using a pre-defined protocol, and Control Logic 58 consists of a dedicated sequencer, a pulse counter a Vpgm control logic, possibly with some parameters stored in a separate ROM (not shown) within Array 54 and read out upon startup. The pulse counter in Control Logic 58 is reset to 0 at the beginning of each programming cycle and counts starting from 0 the number of program pulses launched by the sequencer. Using the pulse count output of the pulse counter, the Sequencer decides from which loop it starts program verifies and/or at which loop it terminates the program loop with a program fail status. The Vpgm control logic in Control Logic 58 calculates Vpgm level of each program pulse. However, the present invention does not depend on the physical location of the above circuit blocks or how they are connected and other arrangements may be used. The programming pulses are applied to a memory cell array 54. Array 54 comprises rows and columns of memory cells. For simplicity in description, the various control circuits for row and column control, as well as other controls, for the memory array have been omitted from FIG. 4.

Circuit 52 controls the programming time of the pulses generated by the charge pump 32 as a function of an indicator signal from control logic 58 indicating the amplitude of the pulses. The program time control circuit 52 generates program time control signals 66 or 74 and supplies such signals to Control Logic 58 to cause the program times allocated for application of the voltage pump pulses from the charge pump 32 to the charge storage elements in array 54 to be adjusted to reduce the number of pulses required for programming the charge storage elements to a predetermined charge state, such as to program charge storage transistors to threshold voltages within a certain predetermined range. These program time control signals are supplied to Control Logic 58 for controlling the length of program time allocated for application of the voltage pump pulses to array 54.

Figure 5:
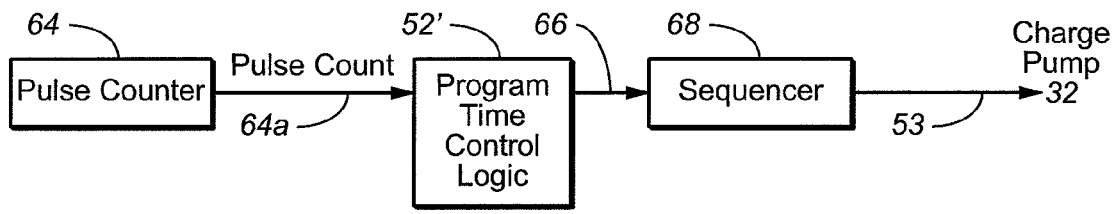
FIG. 5 is a schematic circuit diagram of the program time control circuit and some components of the control logic in FIG. 4 to illustrate an embodiment of the invention.

FIG. 5 is a schematic circuit diagram of one embodiment of the program time control scheme of FIG. 4. Circuit 52' is one implementation of circuit 52 of FIG. 4. Pulse counter 64 and sequencer 68 are parts of the control logic 58 of FIG. 4. As explained above, the pulse counter 64 in logic 58 resets to 0 at the beginning of each programming cycle and counts starting from 0 the number of program pulses launched by the sequencer. The pulse counter 64 outputs a pulse count signal 64a indicating the program pulse count from the beginning of such programming cycle. This pulse count signal is supplied to the program time control logic circuit 52' which may comprise logic circuits that implement a lookup table. This lookup table provides a value of program time corresponding to the pulse count number from counter 64.

Figure 1:
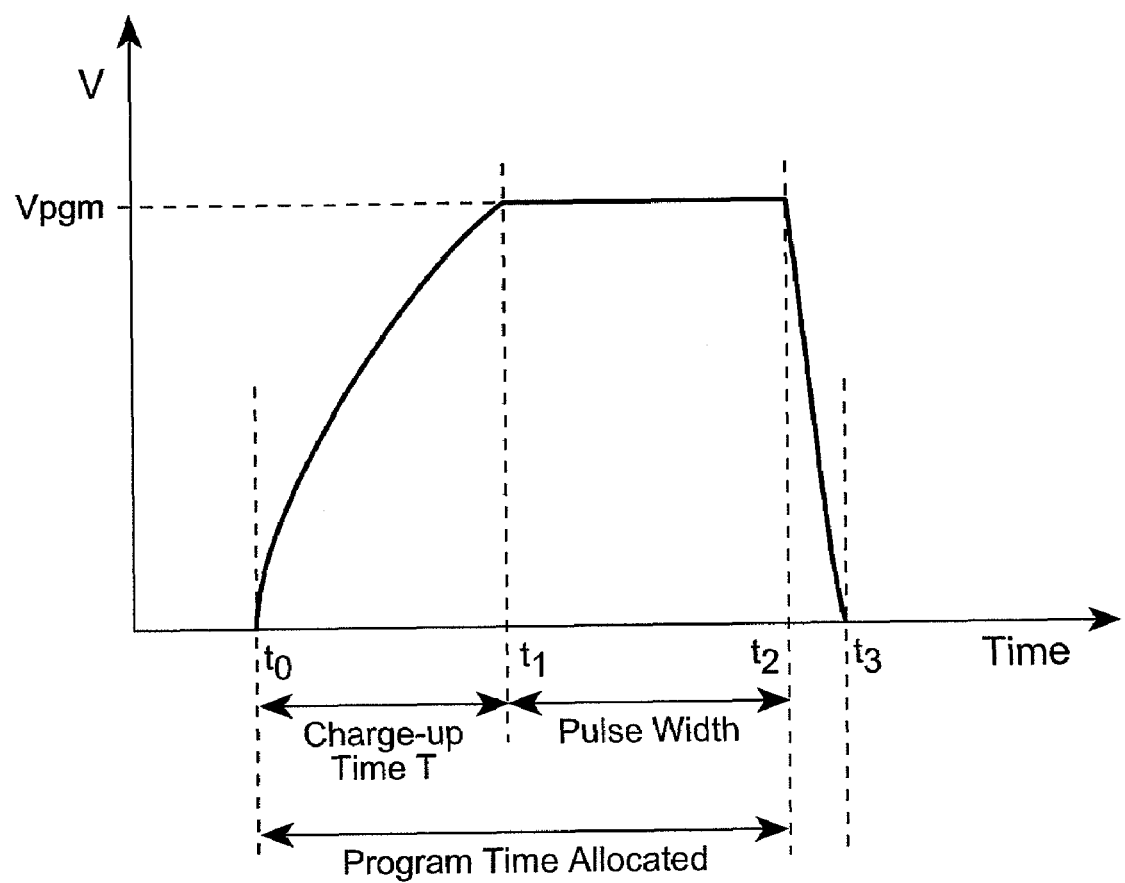
FIG. 1 is a timing diagram of a voltage pump pulse generated by a charge pump useful for illustrating an aspect of the invention.
Figure 2A:
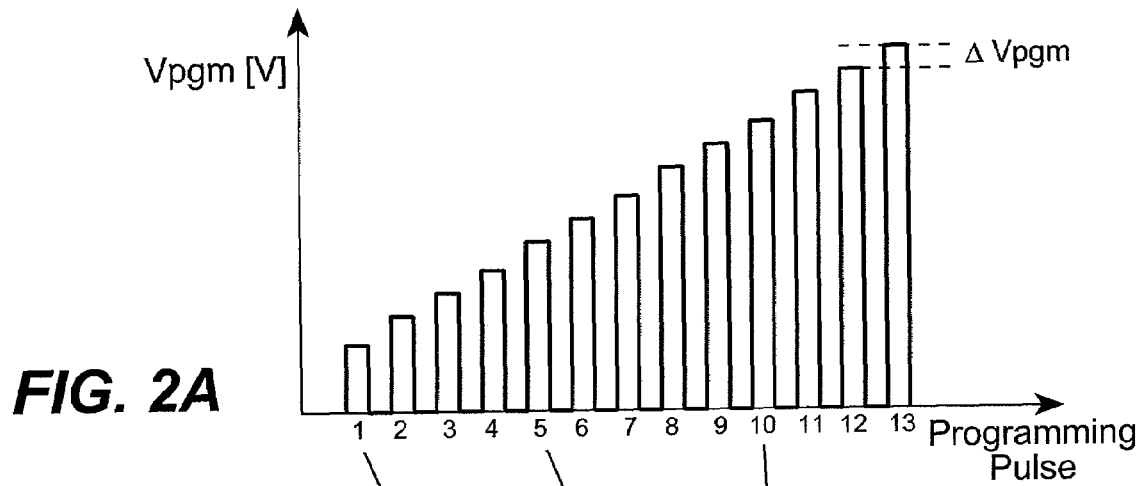
FIG. 2A is a timing diagram of a time sequence of 13 voltage pump pulses at increasing voltage (Vpgm) levels useful for illustrating an aspect of the invention.
Figure 2B:
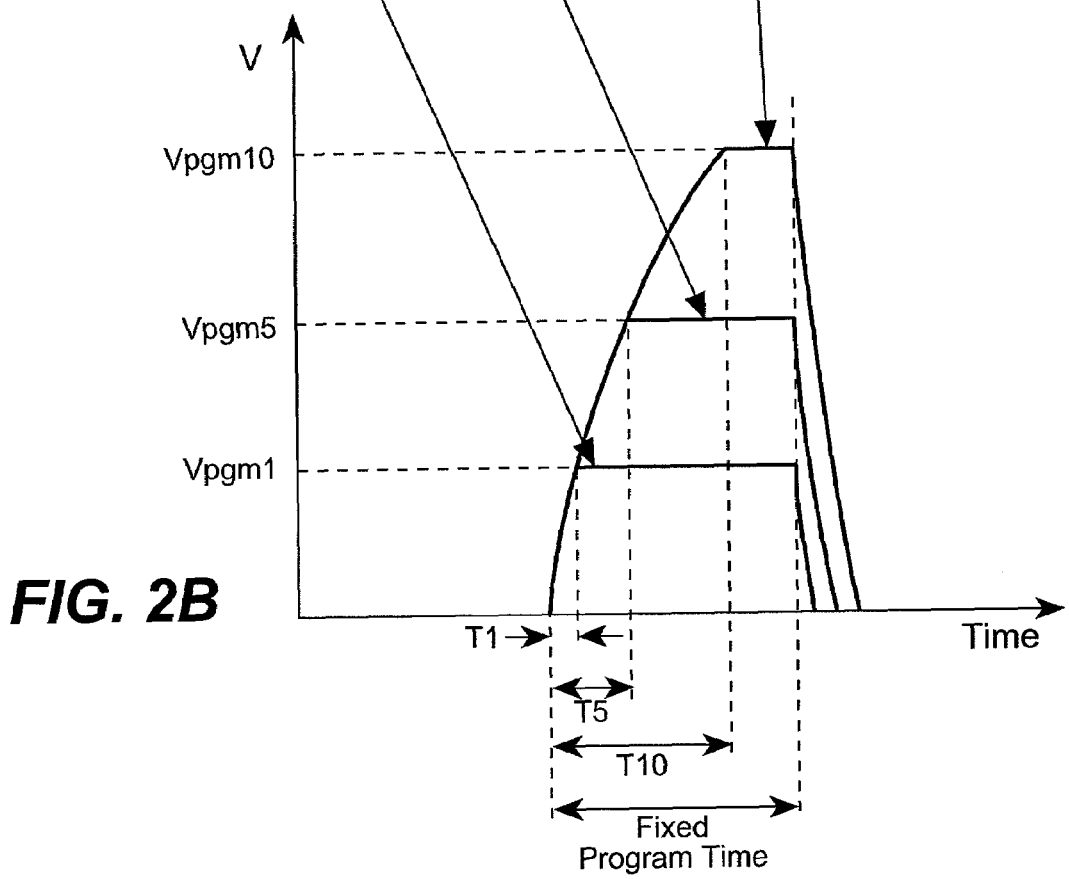
FIG. 2B is a timing diagram of three voltage pump pulses illustrating the fact that voltage pump pulse at a higher voltage level requires a longer charge-up time, useful for illustrating an aspect of the invention.

As illustrated in FIG. 2A, the charge pump increases the voltage level of the programming pulse by a voltage increment $\Delta$Vpgm above the voltage level of the immediately preceding programming pulse, so that if the total number of programming pulses that have been provided during a particular programming cycle is known, the desired Vpgm level can be calculated from such number. From FIG. 1 and the discussion in reference thereto above, it is clear that for any given programming voltage level Vpgm desired, there is a corresponding value for the sum of charge-up time (t0-t1) plus the desired effective program time or pulse width (t1-t2), and that the higher the desired Vpgm value, the larger will be the charge-up time (t0-t1). In order to compensate for the increase in the value of the charge-up time (t0-t1) as Vpgm is increased, the corresponding program time is increased by corresponding amounts, which can be obtained by means of calculation or calibration. By so adjusting the program time corresponding to any value of Vpgm, it is then possible to arrive at a set of program times corresponding to a set of Vpgm values, and therefore also a set of corresponding pulse count values, so as to maintain a substantially constant effective program time (or pulse width) during which the program voltage is maintained at the desired Vpgm for different Vpgm and pulse count values.

By the above described process, for every pulse count, there will be a unique corresponding program time that takes into account the charge-up time required for any particular programming pulse with a particular Vpgm value corresponding to such pulse count. This program time value is then provided in a program time control signal output 66 to sequencer 68 which in turn supplies such program time control signal to the charge pump 32 on line 53. Charge pump 32 then provides the next pump pulse for a programming time period that corresponds to the signal 53. This process is then repeated for generating one or more program time control signals for controlling the program times of one or more pump pulses from pump 32. The effect of such pump pulse program time control is illustrated in FIGS. 7 and 8.

Figure 7:
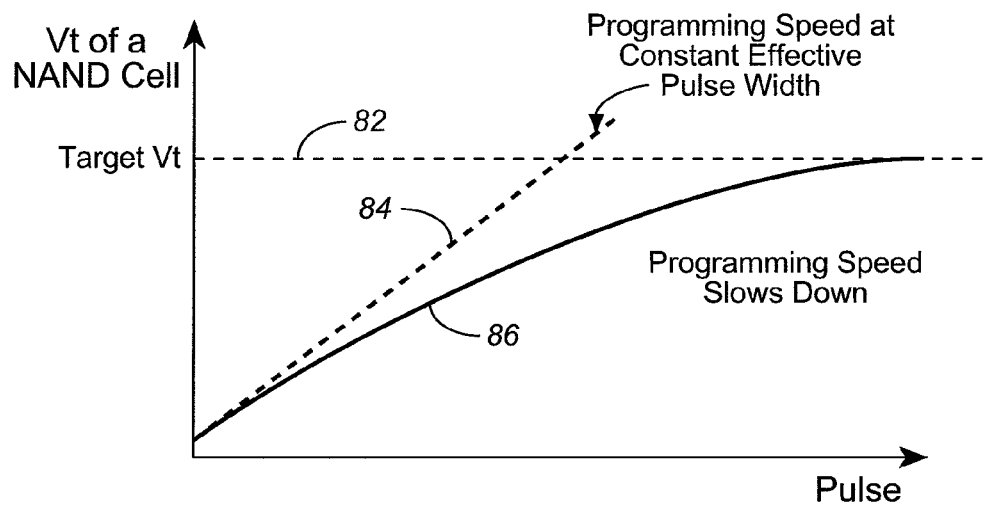
FIG. 7 is a graphical plot of the target threshold voltage Vt of charge storage elements plotted against the number of voltage pump pulses required to program a NAND cell so that the cell reaches the target threshold voltage Vt. The dotted line with positive slope indicates the programming speed at constant pulse width (i.e. constant effective program time) and the solid curve indicates the programming speed at constant program time allocated for programming.

FIG. 7 is a graphical plot of the threshold voltage (on the vertical axis) of the charge storage elements that is achieved by the application of a corresponding number (on the horizontal axis) of voltage pump pulses in the sequence of pulse programming pulses such as those illustrated in FIG. 2A. The target threshold voltage Vt for a particular charge state to be achieved is shown as a horizontal dotted line 82. The dotted slanted line 84 illustrates the threshold voltage of the charge storage elements that can be achieved where the pulse width or effective program time (during which the pulse voltage is maintained at the desired program voltage) is maintained at a constant value as the program voltage Vpgm is increased so as to achieve an optimum programming speed. However, if the same amount of time is allocated for the programming pulses irrespective of the desired voltage level Vpgm, as performed in conventional programming control, the threshold voltage of the charge storage elements that can be achieved corresponding to the number of pulses is shown as the solid line curve 86. As is illustrated in FIG. 7, line 82 intersects curve 86 at a point to the right of its intersection with line 84, indicating that the programming speed achieved with a constant program time allocation requires the application of many more programming pulses and is thus slower compared to one where the effective program time or pulse width is maintained constant.

Figure 8:
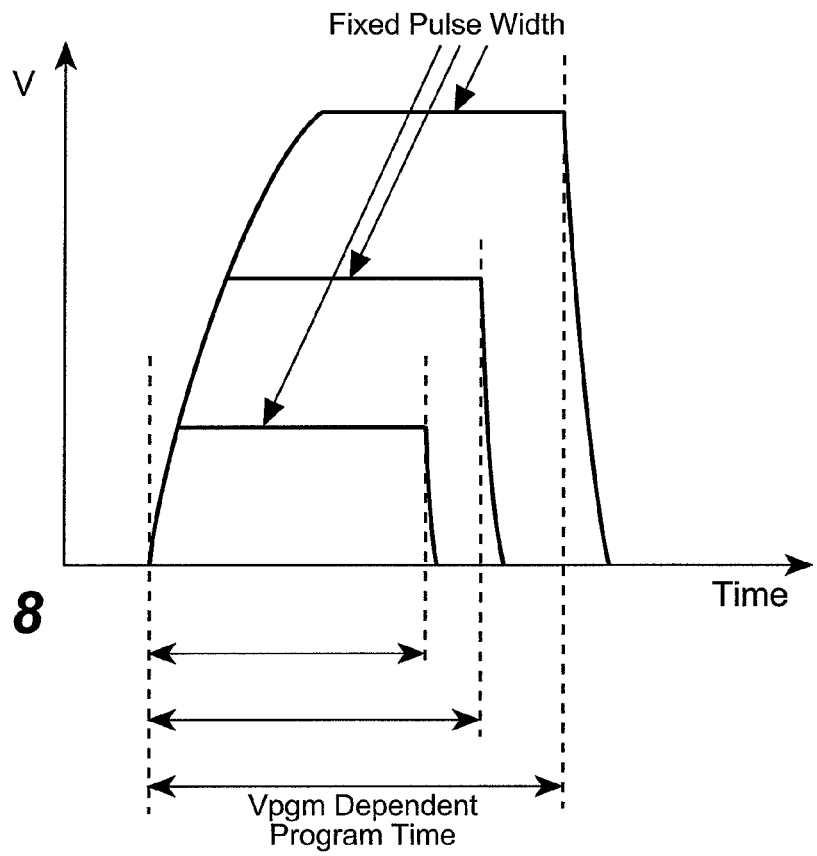
FIG. 8 is a graphical plot of three voltage pump pulses at different voltage levels but with the same pulse width useful to illustrate the invention.

FIG. 8 is a graphical plot of three different programming pulses at three different values of Vpgm. By means of embodiments such as those shown in FIGS. 5 and 6, it is possible to control the program time of the three pulses so that they have effectively the same pulse width as illustrated in FIG. 8. As shown graphically in FIG. 8, as the required program voltage level Vpgm is increased, the amount of program time allocated is also increased correspondingly, so that the effective program time or pulse width remains substantially constant. This allows the optimum programming speed to be achieved, using the fewest number of programming pulses to cause charge storage elements to reach the target threshold voltage Vt, along the dotted line 84 in FIG. 7.

Figure 9:
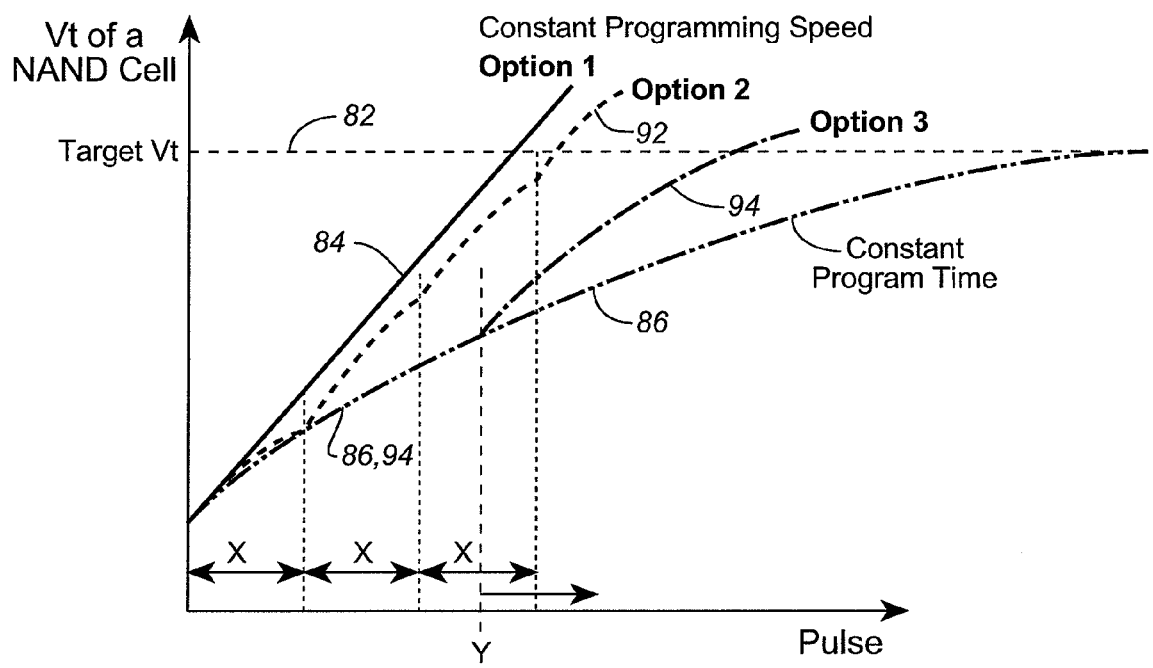
FIG. 9 is a graphical plot of the threshold voltages achieved with three different options for increasing the program time as a function of the required program voltage to illustrate embodiments of the invention.

Thus, when the program voltage Vpgm is increased from one programming pulse to the next, the optimum programming speed is achieved when the program time allocated for application of the voltage pump pulse is increased every time the amplitude of the pulse is increased as illustrated by line 84 in FIGS. 7 and 9, and labeled option 1 in FIG. 9. In this manner, the effective pulse width of the programming pulses can be maintained substantially constant to achieve the optimum programming speed.

However, having to adjust the program time allocated each time the programming voltage increases requires frequent program time adjustment. For some applications, it may not be necessary to increase the program time allocated by the application of the pump pulse each time the programming voltage is increased (such as after the application of every pulse). For example, instead of increasing the program time allocated for application of the voltage pump pulse after the application of every pulse, this can be done after every X number of pulses, where X is an integer equal to or greater than 2. In FIG. 9, this is illustrated by dotted line 92 and labeled option 2 in FIG. 9. In option 2, the program time allocated for application of the voltage pump pulse is increased after the application of every X pulses.

As yet another option, labeled option 3 in FIG. 9, the program time allocated for the application of the voltage pump pulses is maintained at a constant value until Y number of pump pulses have been applied in the programming cycle. Thus as shown in FIG. 9, before Y number of pulses are applied, the threshold voltage that can be achieved is the same in option 3 and in curve 86 obtained in conventional methods of FIG. 7. However, after the program time allocated for the application of pump pulses is increased once after Y number of pulses, the curve 94 of option 3 diverges from curve 86 so that the total number of pulses required to achieve the target threshold Vt is reduced as compared to conventional methods as illustrated in FIG. 9. As shown in FIG. 9, curve 94 intersects the horizontal line 82 at a point closer to the vertical axis compared to where curve 86 intersects line 82.

As yet another possible option different from those above, program time allocated may be increased each time the programming voltage is increased (such as after the application of every pulse) only after Y number of pulses have been applied, but not before this happens. This option is therefore a combination of prior options 1 and 3. The threshold voltage versus number of pulses plot for such combination will be along curve 86 of the conventional methods up to the point until Y number of pulses have been applied to the charge storage transistors, but along a line (not shown) that has substantially the same slope as line 84 in FIG. 9 after such point. Since the charge-up time may not be significant when the Vpgm level is relatively low, the effect of increasing the program time for such Vpgm levels after every program pulse is not as significant, so that there is not a big gain in programming efficiency by increasing the program time over conventional methods as illustrated by curve 86 in FIGS. 7 and 9. However, as the desired Vpgm level is relatively high, the effect of increasing the program time for such Vpgm levels after every program pulse will be significant. Thus by increasing the program time for such Vpgm levels after every program pulse only after Y number of pulses have been applied will achieve a significant gain in programming efficiency, while reducing the number of times the program time is adjusted.

As still another possible option different from those above, program time allocated may be increased, after Y number of pump pulses have been applied but not before this happens, each time X number of the programming pulses have been applied, where X is an integer equal to or greater than 2. This option is therefore a combination of prior options 2 and 3. This option has advantages similar to those when options 1 and 3 are combined, but has the additional advantage that the number of program time adjustments is further reduced. The threshold voltage versus number of pulses plot for such combination will be along curve 86 of the conventional methods up to the point until Y number of pulses have been applied to the charge storage transistors, but along a curve (not shown) that is of substantially the same shape and slope as curve 92 in FIG. 9 after such point.

Figure 6:
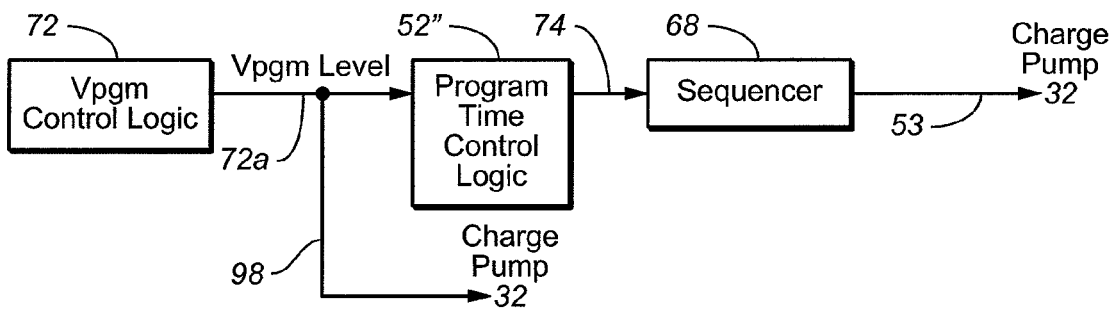
FIG. 6 is a schematic circuit diagram of the program time control circuit and some components of the control logic in FIG. 4 to illustrate another embodiment of the invention.

Instead of counting the number of pulses from the charge pump, the program time may be adjusted as a function of the desired Vpgm level, but without responding to any counting of the pump pulses at all. Circuit 52" of FIG. 6 is another embodiment of circuit 52 of FIG. 4. The embodiment of FIG. 6 includes a program control logic 72 (in logic circuit 58 of FIG. 4) which provides the program voltage level (Vpgm level) in an indicator signal 72a to the program time control logic 52". Similar to program time control logic 52' of FIG. 5, program time control logic 52" also implements a lookup table. Logic 52" provides a program time control signal 74 which indicates a program time corresponding to the input Vpgm level 72a. This program control time signal 74 is provided to sequencer 68 (in logic circuit 58 of FIG. 4) which provides such signal to the charge pump 32 along line 53. Logic 72 also provides the same Vpgm level signal 72a to charge pump 32 along signal line 98 (not shown in FIG. 4), so that the charge pump generates a voltage pump pulse with such Vpgm voltage level. Circuit 52" can also be used to implement the three different options illustrated in FIG. 9, except that instead of increasing the program time after the application of one or more pulses, the program time is increased according to the Vpgm level called for by logic 72. In one implementation of the embodiment of FIG. 6, the program time is increased for every n incremental increases (i.e. n∆Vpgm), where n is an integer equal to or greater than 1. Where n is of the value 1, the programming speed will be the same as the case where the program time is increased after every pump pulse, that is, along line 84 in FIGS. 7 and 9. Where n is of a value greater than 1, the programming speed will be the same as the case where the program time is increased after every n pump pulses, that is, along dotted 92 in FIG. 9. Where the program time is increased only once after m incremental increases, the result is illustrated also by option 3 and line 94 in FIG. 9.

Similar to the combination of options 1 and 3 and of options 2 and 3 above for the embodiment of FIG. 5, similar combinations may be implemented for the embodiment of FIG. 6. Thus, the program time may be increased for every n incremental increases (i.e. n∆Vpgm), where n is an integer equal to or greater than 1, but only after Y incremental increases, and not before this happens. Where n is of the value 1, the programming speed will be the same as the case where options 1 and 3 are combined above for the embodiment of FIG. 5. Where n is of a value greater than 1, the programming speed will be the same as the case where options 2 and 3 are combined above for the embodiment of FIG. 5. These combinations have substantially the same advantages as those explained above for the corresponding combinations in reference to the embodiment of FIG. 5

In another implementation of the embodiment of FIG. 6, the program time is increased at certain values of Vpgm, where these values may be selected to optimize the system, and may correspond to the options 1-3 and combinations thereof as explained above. Under option 1, the program time can be increased every time Vpgm is increased. Under option 2, the program time is set to values corresponding to certain values of Vpgm, where these values may correspond to every X number of pulses in option 2. Alternatively, the program time may be set to values corresponding to certain values of Vpgm, where these values do not correspond to every X number of pulses in option 2. Under option 3, the program time may be held constant in the programming cycle until the Vpgm exceeds a particular predetermined value, at which point the program time is increased to another value which stays unchanged until the end of the programming cycle.

From the above, it is evident that where the program control signal is generated in response to the Vpgm level from logic 72 of FIG. 6, the program control signal is thus provided without making use of the output of charge pump 32. In the embodiment of FIG. 6, the pump pulses are not supplied to circuit 52". This is also true in the embodiment of FIG. 5, where the pump pulses are not supplied to circuit 52'. Hence circuit 52' does not make use of or otherwise measure or sense either the number or the amplitude of the pulses from the charge pump output; instead it simply deduce the program time needed from the pulse count provided by the counter 64 in logic 58. The advantage of adjusting the program time without having to measure either the number or the amplitude of the program pulses from the charge pump output simplifies the implementation of the program time control.

While the invention has been described above by reference to various embodiments, it will be understood that changes and modifications may be made without departing from the scope of the invention, which is to be defined only by the appended claims and their equivalent. All references referred to herein are incorporated by reference.

What is claimed is:

1. A non-volatile memory system comprising:
    a plurality of charge storage elements;
    a charge pump providing sequentially program pulses where the amplitude of each of at least some of the pulses increases relative to a prior pulse during a programming cycle for programming said plurality of charge storage elements; and
    a device that generates a plurality of program time control signals in response to signals indicative of different amplitudes of the pulses provided by the charge pump, said program time control signals causing program times allocated for application of the program pulses to the charge storage elements to be adjusted a plurality of times to values that reduce the number of pulses for programming said plurality of charge storage elements to a predetermined state.

2. The system of claim 1, said device including:
    a first circuit that generates a plurality of indicator signals indicative of amplitudes of the pulses provided by the charge pump, said indicator signals being generated without using amplitude of any output of the charge pump; and
    a second program time control circuit that generates the plurality of program time control signals in response to said indicator signals, causing program times allocated for application of the program pulses to the charge storage elements to be adjusted to values that reduce the number of pulses for programming said plurality of charge storage elements to said predetermined state.

3. The system of claim 2, wherein said plurality of indicator signals are indicative of the number of program pulses provided by the charge pump during said programming cycle to the charge storage elements.

4. The system of claim 3, wherein the program time control signals generated by said second program time control circuit in response to the indicator signals cause the program time allocated for application of the program pulses to increase for every n number of program pulses provided by the charge pump during at least a portion of said programming cycle to the charge storage elements, n being a positive integer.

5. The system of claim 4, wherein n has the value 1.

6. The system of claim 4, wherein the program time allocated for application of the program pulses is increased for every n number of program pulses provided by the charge pump after a predetermined number of pulses have been provided for programming said plurality of charge storage elements during said programming cycle.

7. The system of claim 6, wherein the program time allocated for application of the program pulses is not increased until after the predetermined number of program pulses have been provided for programming said plurality of charge storage elements during said programming cycle.

8. The system of claim 3, wherein the first circuit generates the plurality of indicator signals in response to outputs of the charge pump.

9. The system of claim 2, wherein the first circuit generates the plurality of indicator signals not in response to any output of the charge pump.

10. The system of claim 9, wherein the program time control signals generated by said second program time control circuit in response to the indicator signals cause the program time allocated for application of the program pulses to increase for every n incremental increase(s) in the amplitude of program pulses provided by the charge pump during at least a portion of said programming cycle to the charge storage elements, n being a positive integer.

11. The system of claim 10, wherein n has the value 1.

12. The system of claim 10, wherein the program time allocated for application of the program pulses is increased for every n incremental increase(s) in the amplitude of program pulses provided by the charge pump after a predetermined number of incremental increase(s) in the amplitude of program pulses have occurred during said programming cycle.

13. The system of claim 12, wherein the program time allocated for application of the program pulses is not increased until after the predetermined number of incremental increase(s) in the amplitude of program pulses have occurred during said programming cycle.

14. The system of claim 9, wherein the charge pump generates the program pulses in response to the plurality of indicator signals.

15. A non-volatile memory system comprising:
a plurality of charge storage elements;
a charge pump providing sequentially program pulses where the amplitude of each of at least some of the pulses increases relative to a prior pulse during a programming cycle for programming said plurality of charge storage elements; and
a first circuit that generates at least one indicator signal indicative of amplitude(s) of the pulses provided by the charge pump, said indicator signal(s) being generated without using amplitude of any output of the charge pump;
a second program time control circuit that generates one or more program time control signals in response to said indicator signal(s) causing at least one program time allocated for application of the program pulses to the charge storage elements to be adjusted to value(s) that reduce the number of pulses for programming said plurality of charge storage elements to a predetermined state.

16. The system of claim 15, wherein said at least one indicator signal is indicative of the number of program pulses provided by the charge pump during said programming cycle to the charge storage elements.

17. The system of claim 16, wherein the program time control signals generated by said second program time control circuit in response to the at least one indicator signal cause the program time allocated for application of the program pulses to increase for every n number of program pulses provided by the charge pump during at least a portion of said programming cycle to the charge storage elements, n being a positive integer.

18. The system of claim 17, wherein n has the value 1.

19. The system of claim 17, wherein the program time allocated for application of the program pulses is increased for every n number of program pulses provided by the charge pump after a predetermined number of pulses have been provided for programming said plurality of charge storage elements during said programming cycle.

20. The system of claim 19, wherein the program time allocated for application of the program pulses is not increased until after the predetermined number of pulses have been provided for programming said plurality of charge storage elements during said programming cycle.

21. The system of claim 16, wherein the first circuit generates the at least one indicator signal in response to an output of the charge pump.

22. The system of claim 15, wherein the first circuit generates the at least one indicator signal not in response to any output of the charge pump.

23. The system of claim 22, wherein the program time control signals generated by said second program time control circuit in response to the indicator signal(s) cause the program time allocated for application of the program pulses to increase for every n incremental increase(s) in the amplitude of program pulses provided by the charge pump during at least a portion of said programming cycle to the charge storage elements, n being a positive integer.

24. The system of claim 23, wherein n has the value 1.

25. The system of claim 23, wherein the program time allocated for application of the program pulses is increased for every n incremental increase(s) in the amplitude of program pulses provided by the charge pump after a predetermined number of incremental increase(s) in the amplitude of program pulses have occurred during said programming cycle.

26. The system of claim 25, wherein the program time allocated for application of the program pulses is not increased until after the predetermined number of incremental increase(s) in the amplitude of program pulses have occurred during said programming cycle.

27. The system of claim 15, wherein the charge pump generates the program pulses in response to the one or more program time control signals.

28. The system of claim 15, wherein said at least one indicator signal and said one or more program time control signals cause the program time allocated for application of the program pulses to the charge storage elements to be adjusted only once during said programming cycle to a higher value so that the number of pulses for programming said plurality of charge storage elements to said predetermined state is reduced.

* * * * *